US012706273B2

(12) United States Patent
Fish et al.

(10) Patent No.: US 12,706,273 B2
(45) **Date of Patent: *Aug. 11, 2026**

(54) RADIATION HEATING TO CLEAN DEPOSITS FROM AIR BEARING SHAFT

(71) Applicant: Applied Materials, Inc., Santa Clara, CA (US)

(72) Inventors: Roger B. Fish, Bedford, MA (US); Jeffrey E. Krampert, Topsfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 354 days.

This patent is subject to a terminal disclaimer.

(21) Appl. No.: 18/541,018

(22) Filed: Dec. 15, 2023

(65) Prior Publication Data

US 2025/0201514 A1 Jun. 19, 2025

(51) Int. Cl.
*H01J 37/317* (2006.01)

(52) U.S. Cl.
CPC ................................ *H01J 37/3171* (2013.01)

(58) Field of Classification Search
CPC ........ H01J 37/3171; H01J 37/08; H01J 37/18; H01J 37/20; H01J 37/226; H01J 37/147; H01J 2237/022
USPC .................................................... 250/492.21
See application file for complete search history.

(56) References Cited

U.S. PATENT DOCUMENTS 10,569,299 B2 2/2020 Allen, Jr. et al.
10,971,327 B1 4/2021 Mitchell
10,974,276 B2 4/2021 Allen, Jr. et al.
2008/0280453 A1 11/2008 Koelmel et al.
2009/0140166 A1 6/2009 Muka
2014/0263268 A1* 9/2014 Cong .................. H05B 1/0227 219/443.1
2015/0024579 A1 1/2015 Graff et al.
2016/0204005 A1* 7/2016 Oki ...................... C23C 16/458 118/725
2020/0139401 A1 5/2020 Allen, Jr. et al.
2023/0011261 A1 1/2023 Li et al.
(Continued)

FOREIGN PATENT DOCUMENTS

CN 106381467 A 2/2017
CN 117467962 A 1/2024
(Continued)

OTHER PUBLICATIONS

International Search Report and Written Opinion mailed May 8, 2025 in co-pending PCT application No. PCT/US2025/011720.
(Continued)

*Primary Examiner* — Kiet T Nguyen
(74) *Attorney, Agent, or Firm* — Nields, Lemack & Frame, LLC

(57) ABSTRACT

A system that reduces the buildup of film on a movable shaft that enters and is retracted from a process chamber is disclosed. A ring heater is disposed around the shaft inside the process chamber proximate the air bearing. The ring heater includes a plurality of optical energy emitters arranged around the shaft. The wavelength emitted by the ring heater may be selected to align with the absorption spectrum of the film. In this way, the optical energy serves to heat the film and lower the tendency for the film to adhere to the movable shaft and enter the air bearing.

19 Claims, 6 Drawing Sheets

(56) References Cited

U.S. PATENT DOCUMENTS

| | | | |
|---|---|---|---|
| 2023/0095095 | A1 | 3/2023 | Natarajan et al. |
| 2025/0201510 | A1 | 6/2025 | Fish et al. |
| 2025/0273425 | A1 | 8/2025 | Fish et al. |

FOREIGN PATENT DOCUMENTS

| | | | |
|---|---|---|---|
| KR | 2016-0033168 | A | 3/2016 |
| TW | 202329198 | A | 7/2023 |

OTHER PUBLICATIONS

Office Action mailed Feb. 4, 2026 in co-pending U.S. Appl. No. 18/541,019.

Notice of Allowance mailed Apr. 17, 2026 in co-pending U.S. Appl. No. 18/587,325.

* cited by examiner

RADIATION HEATING TO CLEAN DEPOSITS FROM AIR BEARING SHAFT

FIELD

Embodiments of the present disclosure relate to systems for removing deposits from shafts used in process chambers, and more particularly, shafts that extend into a process chamber via an air bearing.

BACKGROUND

In certain processing systems, a workpiece is disposed in a process chamber, which is maintained at near vacuum conditions. The workpiece may also be disposed on a movable shaft in the process chamber that allows the workpiece to be moved relative to the incoming ion beam.

In these systems, the movable shaft passes through a wall in the process chamber such that part of the shaft is disposed outside the process chamber, while a second part of the shaft is within the process chamber. An air bearing may be used to provide near frictionless motion between the shaft and the wall. The air bearing also serves to maintain the pressure difference between the process chamber and the outside environment. The shaft is able to be translated so that the portion of the shaft that is disposed within the process chamber can be increased or reduced.

In some embodiments, the workpieces are etched using an etching species. Further, the workpiece may be at least partially coated with a photoresist material. The interaction between the photoresist material and the etching species may produce compounds which tend to deposit on the shaft. Over time, these depositions may affect the operation of the air bearing as the shaft is retracted from the process chamber, necessitating a cleaning process to remove this film from the shaft. This reduces throughput and consumes valuable time.

Therefore, it would be beneficial if there were a system that allowed a shaft to be moved relative to the wall of a process chamber, while reducing or minimizing the amount of contaminants that are deposited onto the shaft and enter the air bearing as the shaft is retracted from the chamber.

SUMMARY

A system that reduces the buildup of film on a movable shaft that enters and is retracted from a process chamber is disclosed. A ring heater is disposed around the shaft inside the process chamber proximate the air bearing. The ring heater includes a plurality of optical energy emitters arranged around the shaft. The wavelength emitted by the ring heater may be selected to align with the absorption spectrum of the film. In this way, the optical energy serves to heat the film and lower the tendency for the film to adhere to the movable shaft and enter the air bearing.

According to one embodiment, a workpiece processing system is disclosed. The workpiece processing system comprises a process chamber, maintained at near vacuum conditions; a shaft extending through a wall of the process chamber, wherein the shaft can be extended into and retracted from the process chamber; and a ring heater disposed around the shaft inside the process chamber, wherein the ring heater is configured to emit optical energy toward the shaft. In some embodiments, the optical energy has a wavelength in a mid-infrared range. In some embodiments, a plurality of optical energy emitters are disposed on the ring heater such that the optical energy emitted by the plurality of optical energy emitters is directed toward the shaft. In certain embodiments, the plurality of optical energy emitters comprise laser light emitting diodes (LEDs). In certain embodiments, the laser LEDs emit optical energy having a wavelength between 6 μm and 10 μm. In certain embodiments, the ring heater comprises an inner surface directed toward the shaft and the workpiece processing system further comprises a laser source located outside the process chamber, in communication with fiberoptic cables, wherein the fiberoptic cables terminate along the inner surface, and the plurality of optical energy emitters comprise ends of the fiberoptic cables. In certain embodiments, the laser source comprises a $CO_2$ laser. In some embodiments, the $CO_2$ laser emits optical energy at a wavelength between 9.3 μm and 10.6 μm. In some embodiments, an ion source is in communication with the process chamber. In some embodiments, the system comprises an air bearing through which the shaft extends into the process chamber, wherein the ring heater is disposed proximate to the air bearing.

According to another embodiment, a beam-line ion implantation system is disclosed. The beam-line ion implantation system comprises an ion source to generate an ion beam; a mass analyzer; a process chamber, maintained at near vacuum conditions; one or more beam-line components to direct the ion beam toward a process chamber; a shaft extending through a wall of the process chamber, wherein the shaft can be extended into and retracted from the process chamber; and a ring heater disposed around the shaft inside the process chamber, wherein the ring heater is configured to emit optical energy toward the shaft. In some embodiments, the system comprises an air bearing through which the shaft extends into the process chamber, wherein the ring heater is disposed proximate to the air bearing. In some embodiments, the optical energy has a wavelength in a mid-infrared range. In some embodiments, a plurality of optical energy emitters are disposed on the ring heater such that the optical energy emitted by the plurality of optical energy emitters is directed toward the shaft. In certain embodiments, the plurality of optical energy emitters comprise laser light emitting diodes (LEDs). In certain embodiments, the laser LEDs emit optical energy having a wavelength between 6 μm and 10 μm. In some embodiments, the ring heater comprises an inner surface directed toward the shaft and the beam-line ion implantation system further comprises a laser source located outside the process chamber, in communication with fiberoptic cables, wherein the fiberoptic cables terminate along the inner surface, and the plurality of optical energy emitters comprise ends of the fiberoptic cables. In certain embodiments, the laser source comprises a $CO_2$ laser. In certain embodiments, the $CO_2$ laser emits emitting optical energy at a wavelength between 9.3 μm and 10.6 μm.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain systems, a workpiece is moved relative to the ion source via a movable shaft. A portion of this movable shaft may extend outside the process chamber. Additionally, the actuator that controls the movement of the shaft may also be disposed outside the process chamber. The process chamber is typically maintained at near vacuum conditions, which may be less than 50 millitorr. In certain embodiments, the process chamber may be maintained at less than 10 millitorr. The environment outside the process chamber is typically at atmospheric pressure. An air bearing may be used to maintain the pressure differential between the outside environment and the process chamber. However, contaminants, such as a film, may collect on the portion of the shaft that is inside the process chamber. These contaminants may then enter the air bearing when the shaft is retracted from the process chamber. As described above, this film may affect the operation of the air bearing and necessitate cleaning cycles.

Figure 1A:
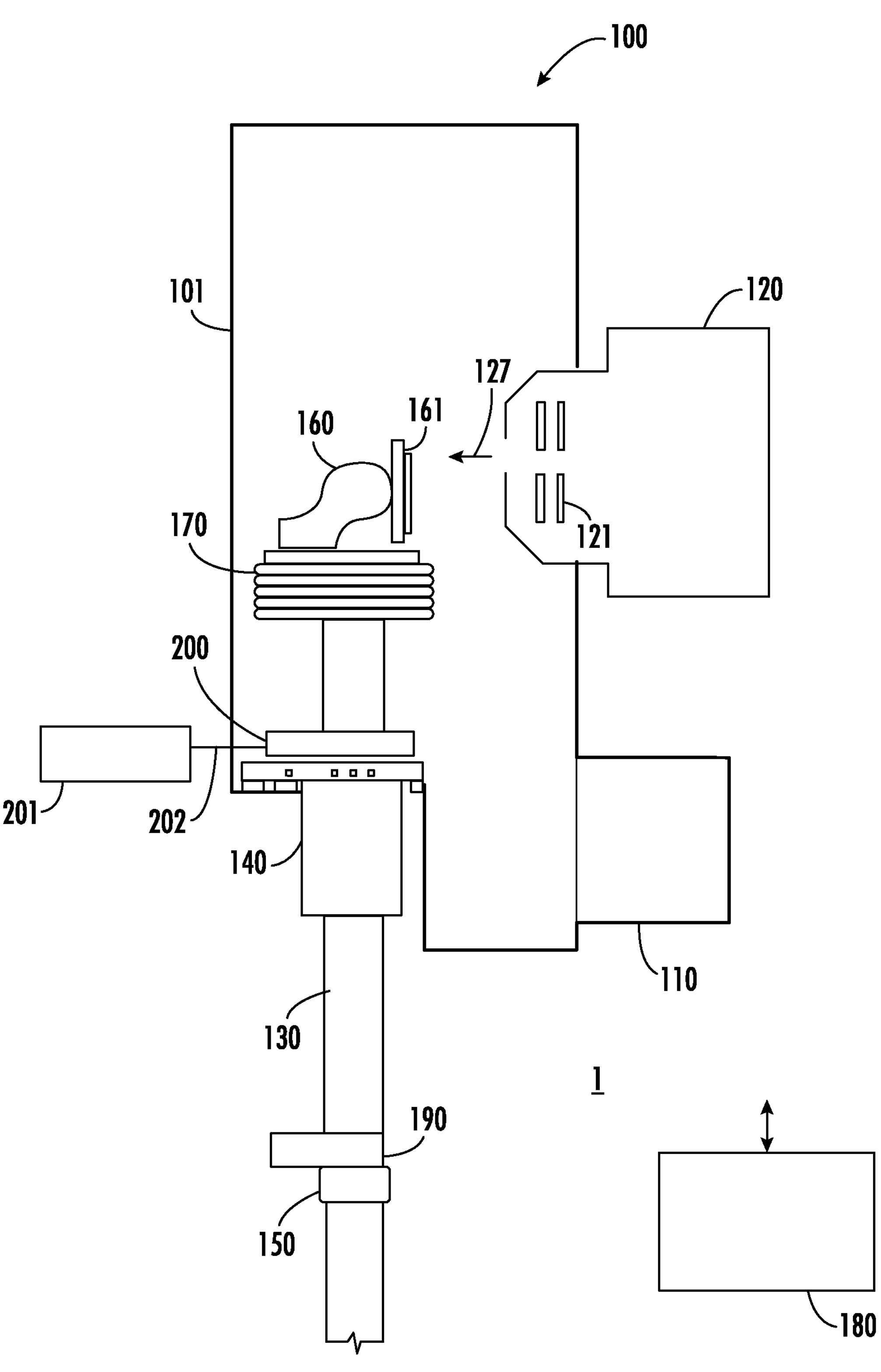
FIG. 1A is a view of the process chamber that utilizes the ring heater according to one embodiment.

FIG. 1A shows a workpiece processing system that addresses this issue according to one embodiment. The system may be used for etching, deposition or ion implantation processes. The system includes a process chamber 100, which comprises a plurality of walls 101 that define a sealed volume, which is maintained at near vacuum conditions. One or more vacuum pumps 110 may be in communication with the interior of the process chamber 100 to maintain the near vacuum pressure within the process chamber 100. As noted above, the pressure within the process chamber 100 may be less than 50 millitorr in certain embodiments. In other embodiments, the pressure within the process chamber 100 may be less than 10 millitorr. An ion source 120 may also be in communication with the process chamber 100. One or more extraction electrodes 121 may be disposed within the housing of the ion source 120 to extract the ion beam 127 from the ion source 120. In certain embodiments, a portion of the housing of the ion source 120 is disposed within the process chamber 100.

Figure 5:
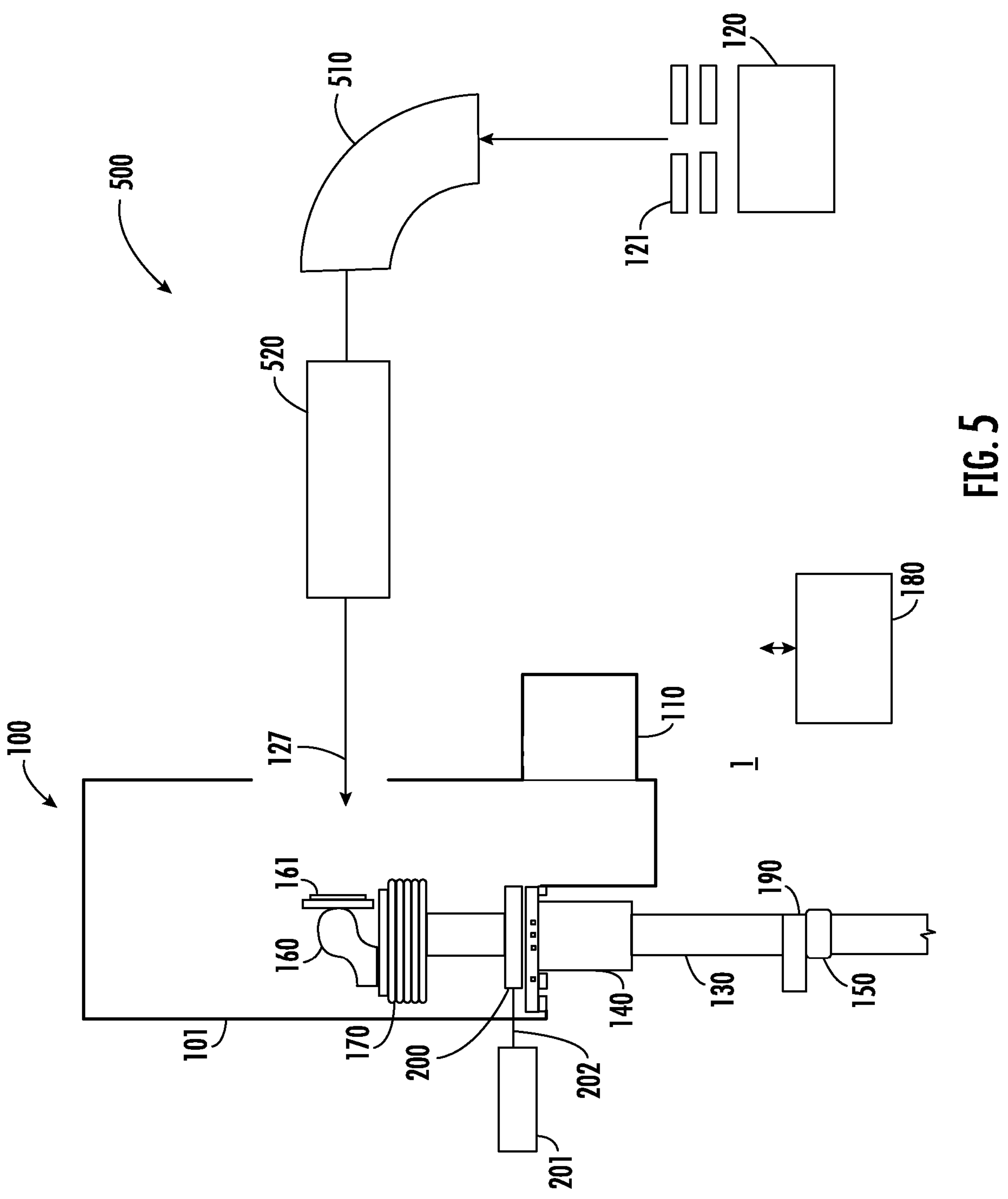
FIG. 5 shows a beam-line ion implantation system that includes a process chamber utilizing the ring heater.

In other embodiments, one or more components may be disposed between the ion source 120 and the process chamber 100. For example, as shown in FIG. 5, a beam-line ion implantation system 500 may have an ion source 120, one or more extraction electrodes 121, a mass analyzer 510, and one or more beam-line components 520, such as one or more acceleration/deceleration stages and a collimator, disposed between the ion source 120 and the process chamber 100. The one or more beam-line components 520 serve to direct the ion beam 127 from the ion source 120 toward the process chamber 100.

Figure 1B:
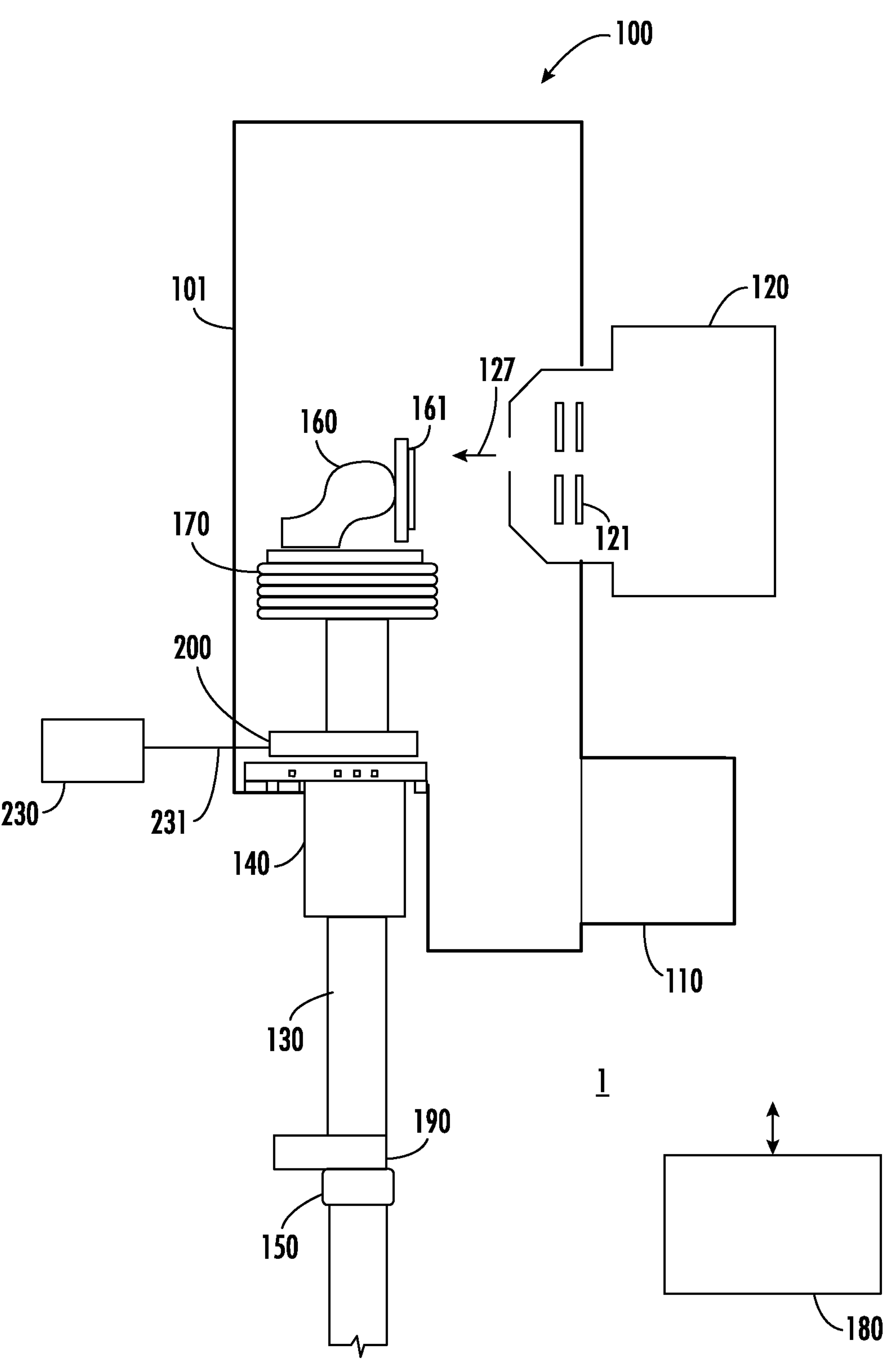
FIG. 1B is a view of the process chamber that utilizes the ring heater according to a second embodiment.

Further, while FIGS. 1A-1B show the ion source 120 in direct communication with the process chamber 100, and FIG. 5 shows one embodiment of a beam-line ion implantation system 500, other embodiments are possible and the disclosure is not limited to the embodiments shown in the figures. Thus, the process chamber 100 may be used for any process which may include additional or fewer components within and outside the process chamber 100.

As seen in FIGS. 1A-1B and FIG. 5, a shaft 130 extends into the process chamber 100. The shaft 130 may be stainless steel. In certain embodiments, the shaft 130 may be nickel coated. In certain embodiments, an air bearing 140 is used to form the barrier between the vacuum conditions within the process chamber 100 and the atmospheric environment 1 external to the process chamber 100. The air bearing 140 also creates a near frictionless interface between the shaft 130 and the wall 101 of the process chamber 100. The shaft 130 may be extended or retracted from the process chamber 100 by means of an actuator 150. A platen 160 is disposed at the end of the shaft 130 that is disposed in the process chamber 100.

A controller 180 may be in communication with the actuator 150 to control the movement of the shaft 130. The controller 180 includes a processing unit and an associated memory device. This memory device contains the instructions, which, when executed by the processing unit, enable the controller 180 to perform the functions described herein. This memory device may be a non-volatile memory, such as a FLASH ROM, an electrically erasable ROM or other suitable devices. In other embodiments, the memory device may be a volatile memory, such as a RAM or DRAM. The processing unit may be a general purpose computer, a special purpose computer, a microcontroller or another type of electrical circuit.

During operation, an ion beam 127 may be extracted from the ion source 120 and directed toward the workpiece 161 that is disposed on the platen 160. The ion beam 127 may not be able to impact the entirety of the workpiece 161 at one time. Therefore, the workpiece 161 may be translated relative to the ion beam 127. This is performed by extending and retracting the shaft 130 from the process chamber 100 using the actuator 150.

As stated above, an air bearing 140 may be utilized to maintain the vacuum seal and to allow near frictionless movement of the shaft 130 relative to the wall 101 of the process chamber 100. Air bearings use a layer of pressurized gas between the shaft 130 and the wall 101 to provide a near frictionless interface.

When the shaft 130 is extended to its maximum position in the process chamber 100, a first fraction of the shaft 130 is disposed within the process chamber 100. Conversely, when the shaft 130 is retracted to its minimum position in the process chamber, a second fraction, smaller than the first fraction, is disposed in the process chamber 100. The retraction of the shaft 130 may be limited by a first end stop 170. Similarly, the extension of the shaft 130 into the process chamber 100 may be limited by a second end stop 190. The end stops define the range of motion of the shaft 130.

It has been found that, in conventional systems, contaminants, such as a film, may be deposited on the portion of the surface of the shaft 130 that is disposed inside the process chamber 100 while the workpiece is being processed. In certain embodiments, the workpiece 161 may be partially coated with a photoresist material, that contains carbon. When the photoresist material reacts with the etching species in the ion beam 127, carbon-based particles may form. These carbon-based particles may form a film on a colder surface, such as the shaft 130. When the shaft 130 is then retracted from the process chamber 100, this film enters the air bearing 140. This film may affect the operation of the air bearing 140, forcing periodic cleaning cycles to remove the film from the shaft 130.

Figure 2:
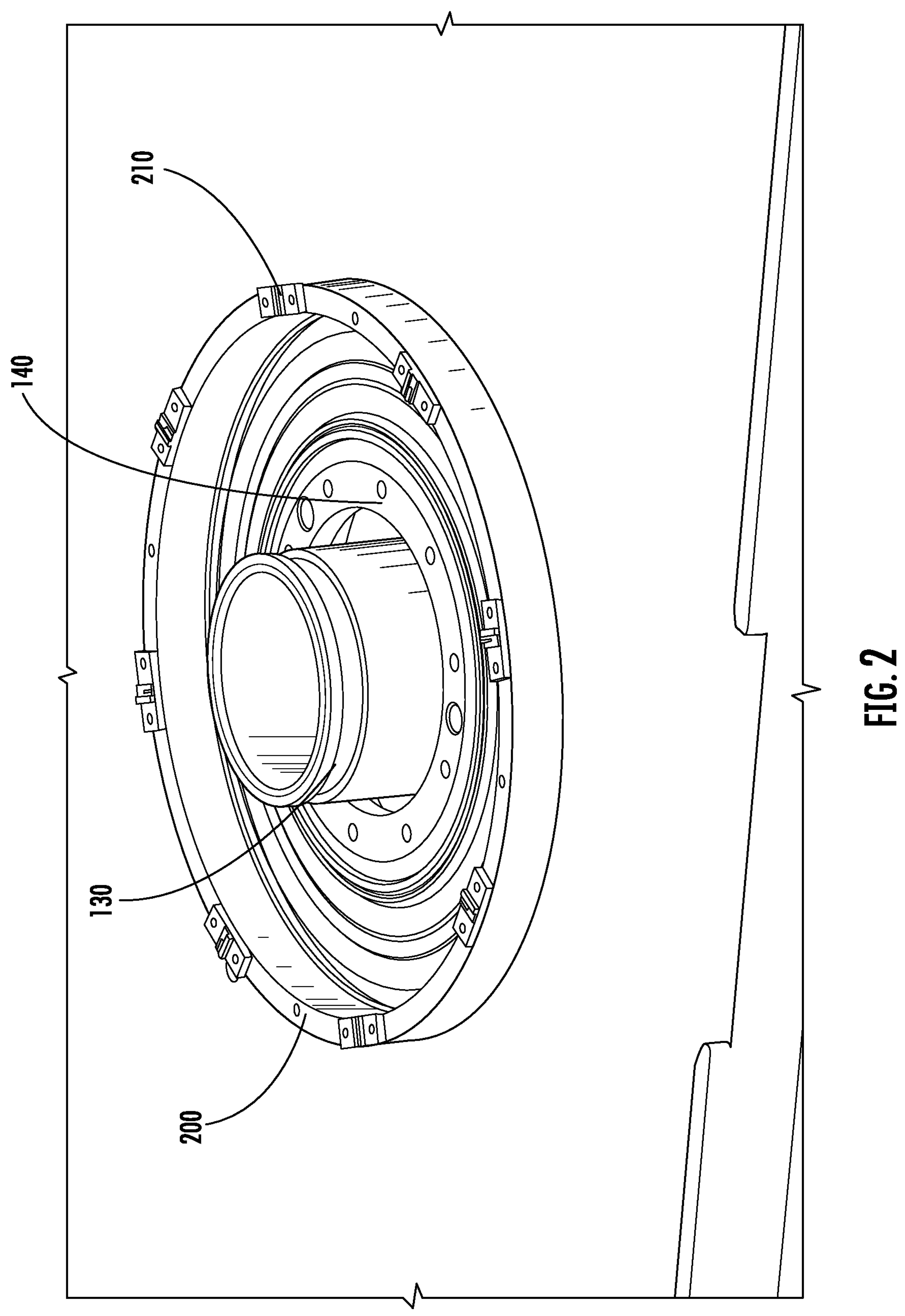
FIG. 2 shows the position of the ring heater relative to the air bearing.

To overcome these issues, a ring heater 200 is installed around the shaft 130. The ring heater 200 is located inside the process chamber 100. As best seen in FIG. 2, in certain embodiments, the ring heater 200 has a hollow round center that surrounds the shaft 130. The ring heater 200 is positioned as close to the air bearing 140 as practical so as to heat the shaft 130 and remove any film disposed on the shaft 130 before it enters the air bearing 140. For example, the ring heater 200 may be less than 2 inches from the air bearing 140. In certain embodiments, the ring heater 200 may be less than 1 inch from the air bearing 140.

Figure 3:
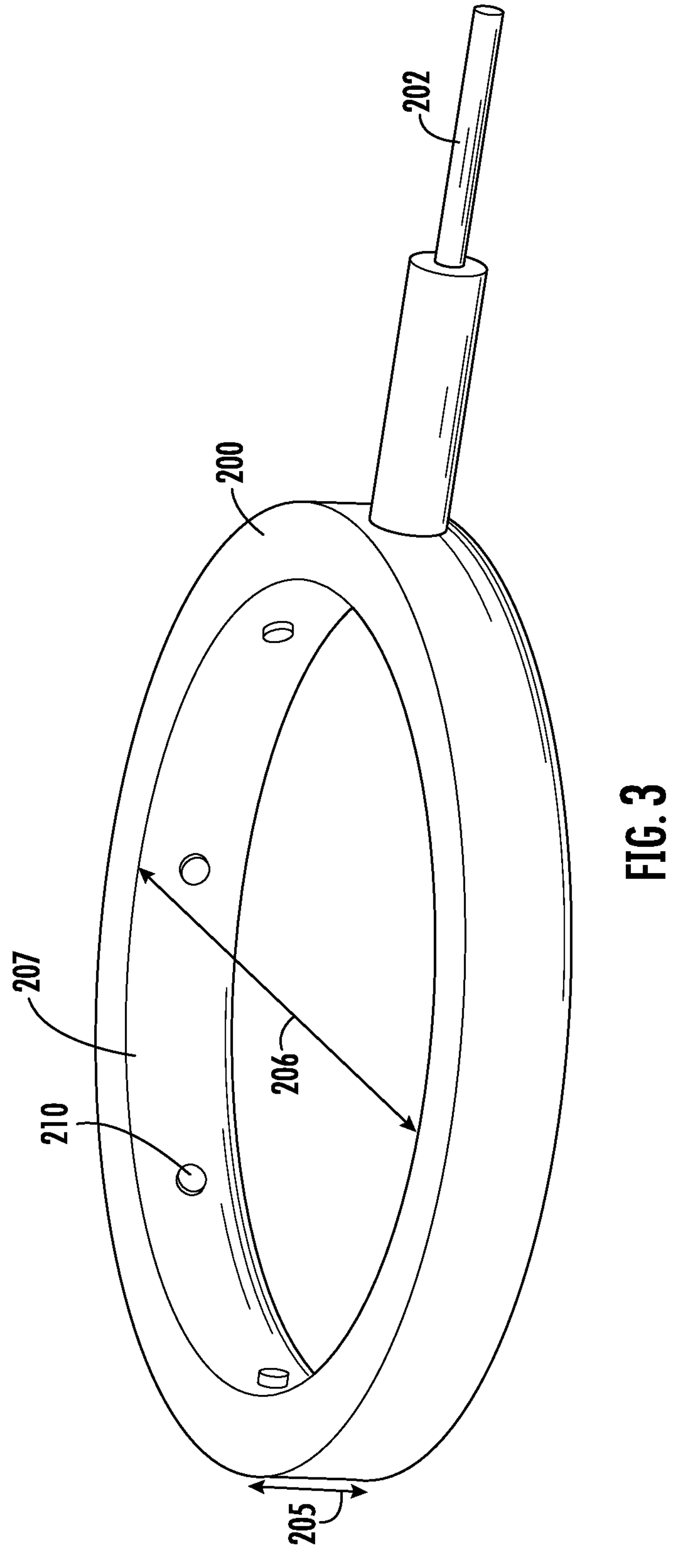
FIG. 3 shows the ring heater according to one embodiment.

FIG. 3 shows an enlarged view of the ring heater 200 according to one embodiment. The ring heater 200 may be constructed of any suitable material, such as aluminum, stainless steel, graphite or other thermally conductive materials. The hollow round center has an inner diameter 206. The inner diameter 206 of the ring heater 200 may be slightly larger than the outer diameter of the shaft 130. In some embodiments, the inner diameter of the ring heater 200 may be less than 1 inch larger than the outer diameter of the shaft 130. Further, the ring heater 200 has a thickness 205, which is perpendicular to the direction of the inner diameter of the ring heater 200, and is defined as the distance between the top surface and the bottom surface. Thus, a region having the thickness 205 located along the inner diameter 206 of the ring heater 200 forms an inner surface 207.

The ring heater 200 includes a plurality of optical energy emitters 210, which are disposed on the ring heater such that energy emitted by the optical energy emitters is directed toward the shaft 130. In some embodiments, the plurality of optical energy emitters may be arranged along the inner surface 207 of the ring heater 200, so as to face the shaft 130. For example, the optical energy emitter 210 may be disposed on the inner surface 207. Alternatively or additionally, the optical energy emitters 210 may be disposed on the top and/or bottom surface of the ring heater 200 and be directed toward the shaft 130. In this disclosure, optical energy is defined as energy radiated in the ultraviolet through infrared bands, having a wavelength between, for example, 10 nm and 30 μm. The number of optical energy emitters 210 is not limited and may be selected to ensure that optical energy is directed at the entire diameter of the shaft 130. Further, the optical energy emitters 210 may be disposed in a single row in the thickness direction, or in multiple rows along the inner surface 207. The number of optical energy emitters 210 and their configuration may be determined based on the power level emitted by each optical energy emitter 210, the diameter of the shaft 130, the thickness of the ring heater 200, the translation speed of the shaft 130, and the amount of film to be removed.

The film that is deposited on the shaft 130 may contain carbon and fluorine atoms. Thus, in some embodiments, the film may be polytetrafluoroethylene (PTFE) or a similar compound. PTFE has a relatively high absorption in the mid-infrared band, such as at wavelengths between 6 μm and 10 μm. Thus, in one embodiment, the optical energy emitted by the optical energy emitters 210 is in the mid-infrared range.

Figure 4:
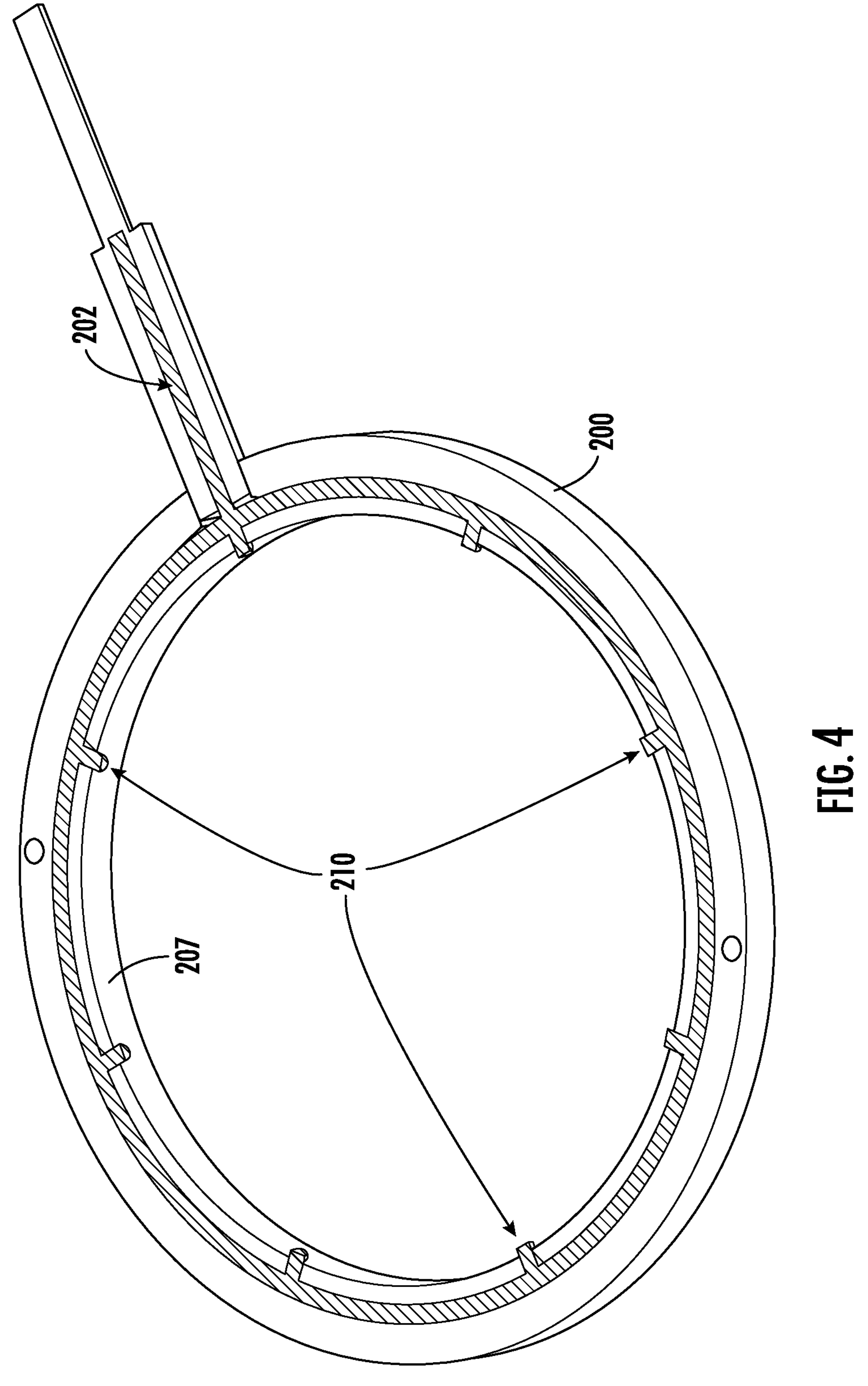
FIG. 4 shows a cross-sectional view of the ring heater according to one embodiment.

In some embodiments, a laser source 201 (see FIG. 1A) is used to generate optical energy at the desired wavelength. The laser source 201 may be disposed outside the process chamber 100 in the atmospheric environment 1. This laser source 201 may utilize continuous wave (CW) operation. In one embodiment, the laser source 201 may be a carbon dioxide ($CO_2$) laser. $CO_2$ lasers are capable of generating in excess of 20 W, and in certain instances more than 100 W, and emit optical energy at wavelengths between 9.3 μm and 10.6 μm. In some embodiments, due to the high power output of the $CO_2$ laser, any wavelength in this range may be used to effectively remove the film from the shaft 130. In other embodiments, a particular wavelength in this range may be used. In some embodiments, a laser source using a different gas may be used to generate the optical energy. The energy from the laser source 201 is transmitted through the fiberoptic cables 202 to the ring heater 200. The fiberoptic cables 202 may include a core and an external cladding. In some embodiments, the core may be polycrystalline infrared optical fibers and the cladding may be constructed from a halide material, such as silver halide. The fiberoptic cables 202 pass through a wall of the process chamber 100, such as via a vacuum seal. In this embodiment, as best seen in the cross-sectional view of FIG. 4, the ring heater 200 includes a plurality of fiberoptic cables 202 that are each directed toward an opening in the inner surface 207 of the ring heater 200. In this embodiment, the optical energy emitters 210 are openings in the inner surface 207 where the fiberoptic cables 202 terminate. The fiberoptic cables 202 may terminate at the inner surface 207 so as to be normal to that surface. In some embodiments, focusing lenses may be disposed at the openings in the inner surface 207 to focus the optical energy. However, in embodiments where the ring heater 200 is relatively close to the shaft 130, focusing lenses may not be utilized.

In some embodiments, the laser source 201 may emit optical energy at a power level of 20 W or greater. In some embodiments, the power level may be up to 100 W or more.

In another embodiment, shown in FIG. 1B, the optical energy emitters 210 may be laser light emitting diodes (LEDs) or other similar semiconductor devices that are able to generate optical energy at the desired wavelength. These laser light emitting diodes may also be referred to as laser LEDs or laser diodes. For example, mid-infrared laser diodes that emit energy in the mid-infrared range, such as at wavelengths between 7 μm and 10 μm, may be used. In one specific embodiment, laser diodes that emit optical energy at wavelengths between 8 μm and 9 μm may be employed. One possible placement of the laser diodes on the ring heater 200 may be seen in FIG. 2. For example, these laser diodes may be mounted on the ring heater 200 such that energy emitted by the laser diodes is directed toward the shaft 130. In some embodiments, the plurality of laser diodes may be arranged along the inner surface 207 of the ring heater 200, so as to face the shaft 130. For example, the laser diodes may be disposed on the top and/or bottom surface of the ring heater 200 and be directed toward the shaft 130. Alternatively or additionally, the laser diodes may be disposed on the inner surface 207. In this embodiment, as shown in FIG. 1B, the LED power supply 230 may be disposed outside the process chamber 100 in the atmospheric environment 1. The power cables 231 pass through a wall of the process chamber 100, such as via a vacuum seal. The rest of the components are as described with respect to FIG. 1A.

Note that while FIG. 5 shows the laser source 201 and fiberoptic cables 202, it is understood that the beam-line ion implantation system 500 may instead include the laser diodes and LED power supply 230, as shown in FIG. 1B.

In each of these embodiments, the optical energy emitters 210 comprises devices that radiate optical energy at the desired wavelength, which may be in the mid-infrared range. These optical energy emitters may be laser diodes or the ends of a fiberoptic cable.

In certain embodiments, the total amount of power used by the ring heater 200 may be at least 1 W per $cm^2$ of shaft surface area. In other embodiments, this power level may be adjusted based on the amount of film to be removed as well as the translation speed of the shaft 130.

The controller 180 may be used to control the ring heater 200. In certain embodiments, the ring heater 200 is activated when the shaft 130 is being retracted from the process chamber 100, so as to heat the film before it enters the air bearing 140. In certain embodiments, the ring heater 200 is not activated when the shaft 130 is being translated into the process chamber 100 or is stationary. In other embodiments, the controller 180 may activate the ring heater 200 during preventative maintenance processes. Further, in certain embodiments, the translational speed of the shaft 130 may be slowed during the preventative maintenance process to allow more optical energy to be absorbed.

In some embodiments, the shaft 130 is coated with nickel. This provides a lower emissivity surface such that there is minimal heating of the shaft 130 and the optical energy reflects from the shaft 130, creating more photons to energize the film.

The system and method described herein have many advantages. First, as noted above, during certain semiconductor processes, such as etch processes, a film may form on the shaft 130 disposed in the process chamber 100. This film may then begin coating the air bearing, affecting its operation. By heating the film, less material may adhere to the shaft, extending the operation of the air bearing before preventative maintenance is performed. Additionally, other mechanisms to eliminate this film have significant drawbacks. Heating the shaft 130 using conventional methods to inhibit the condensation of the film is problematic, as the heating of the shaft 130 increases its diameter, creating issues when passing through the air bearing 140. Further, the amount of energy to heat the entirety of the shaft 130 exceeds that used to direct the optical energy at a specific portion of the shaft 130. This disclosed approach significantly reduces the amount of film that enters the air bearing, while retaining all of the existing components in the system. Additionally, due to the low emissivity of the shaft 130, there is little heating of the shaft 130 by the ring heater 200 so thermal expansion of the shaft, which can be problematic, is not an issue.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
- a process chamber, maintained at near vacuum conditions;
- a shaft extending through a wall of the process chamber, wherein the shaft can be extended into and retracted from the process chamber; and
- a ring heater disposed around the shaft and inside the process chamber, wherein the ring heater is configured to emit optical energy toward the shaft.

2. The workpiece processing system of claim 1, wherein the optical energy has a wavelength in a mid-infrared range.

3. The workpiece processing system of claim 1, wherein a plurality of optical energy emitters are disposed on the ring heater such that the optical energy emitted by the plurality of optical energy emitters is directed toward the shaft.

4. The workpiece processing system of claim 3, wherein the plurality of optical energy emitters comprise laser light emitting diodes (LEDs).

5. The workpiece processing system of claim 4, wherein the laser LEDs emit optical energy having a wavelength between 6 μm and 10 μm.

6. The workpiece processing system of claim 3, wherein the ring heater comprises an inner surface directed toward the shaft and wherein the workpiece processing system further comprises a laser source located outside the process chamber, in communication with fiberoptic cables, wherein the fiberoptic cables terminate along the inner surface, and wherein the plurality of optical energy emitters comprise ends of the fiberoptic cables.

7. The workpiece processing system of claim 6, wherein the laser source comprises a $CO_2$ laser.

8. The workpiece processing system of claim 7, wherein the $CO_2$ laser emits optical energy at a wavelength between 9.3 μm and 10.6 μm.

9. The workpiece processing system of claim 1, further comprising an ion source in communication with the process chamber.

10. The workpiece processing system of claim 1, further comprising an air bearing through which the shaft extends into the process chamber, wherein the ring heater is disposed proximate to the air bearing.

11. A beam-line ion implantation system comprising:
- an ion source to generate an ion beam;
- a mass analyzer;
  - a process chamber, maintained at near vacuum conditions;
- one or more beam-line components to direct the ion beam toward a process chamber;
- a shaft extending through a wall of the process chamber, wherein the shaft can be extended into and retracted from the process chamber; and
  - a ring heater disposed around the shaft and inside the process chamber, wherein the ring heater is configured to emit optical energy toward the shaft.

12. The beam-line ion implantation system of claim 11, further comprising an air bearing through which the shaft extends into the process chamber, wherein the ring heater is disposed proximate to the air bearing.

13. The beam-line ion implantation system of claim 11, wherein the optical energy has a wavelength in a mid-infrared range.

14. The beam-line ion implantation system of claim 11, wherein a plurality of optical energy emitters are disposed on the ring heater such that the optical energy emitted by the plurality of optical energy emitters is directed toward the shaft.

15. The beam-line ion implantation system of claim 14, wherein the plurality of optical energy emitters comprise laser light emitting diodes (LEDs).

16. The beam-line ion implantation system of claim 15, wherein the laser LEDs emit optical energy having a wavelength between 6 μm and 10 μm.

17. The beam-line ion implantation system of claim 14, wherein the ring heater comprises an inner surface directed toward the shaft and wherein the beam-line ion implantation system further comprises a laser source located outside the process chamber, in communication with fiberoptic cables, wherein the fiberoptic cables terminate along the inner surface, and wherein the plurality of optical energy emitters comprise ends of the fiberoptic cables.

18. The beam-line ion implantation system of claim 17, wherein the laser source comprises a $CO_2$ laser.

19. The beam-line ion implantation system of claim 18, wherein the $CO_2$ laser emits emitting optical energy at a wavelength between 9.3 μm and 10.6 μm.

* * * * *